United States Patent [19]
Pfeiffer et al.

[11] Patent Number: 5,363,394
[45] Date of Patent: Nov. 8, 1994

[54] QUANTUM WIRE LASER

[75] Inventors: Loren N. Pfeiffer, Harding Township, Morris County; Horst L. Stormer, Summit; Werner H. Wegscheider, Gillette; Kenneth W. West, Mendham Township, Morris County, all of N.J.

[73] Assignee: AT&T Bell Laboratories, Murray Hill, N.J.

[21] Appl. No.: 103,876

[22] Filed: Aug. 6, 1993

[51] Int. Cl.$^5$ .............................................. H01S 3/19
[52] U.S. Cl. ........................................ 372/45; 372/44
[58] Field of Search ................ 372/45, 50, 44, 46; 437/129

[56] References Cited

PUBLICATIONS

Y. Chang et al, "A New One-Dimensional Quantum Well Structure", Dec. 15, 1985, pp. 1324–1326, Appl. Phys. Lett. 47 (12).

A. R. Goni et al, "Observation of Quantum Wire Formation At Intersecting Quantum Wells", Oct. 19, 1992, pp. 1956–1958, Appl. Phys. Lett. 61 (16).

*Primary Examiner*—Georgia Y. Epps

[57] ABSTRACT

Intersecting quantum wells form a T-shaped structure. Quantum bound states exist due to the spreading out of the wave function in the T-junction region. The confined state leads to formation of a quantum wire in which one-dimensional carrier behavior extends along a wire-like region defined by the intersecting planes of the two wells. By embedding such a region in a T-shaped optical waveguide, a quantum wire laser characterized by low-threshold stimulated emission in the one-dimensional quantum limit is provided.

21 Claims, 3 Drawing Sheets

QUANTUM WIRE LASER

BACKGROUND OF THE INVENTION

This invention relates to lasers and, more particularly, to quantum wire (QWR) lasers operating in the quantum limit.

It is well known that quantum well (QWL) semiconductor lasers exhibit improved performance characteristics compared to conventional heterostructure diode lasers. In QWL lasers, charge carriers are quantum confined in one dimension in extremely thin active layers. Additionally, it is known that further improvement in semiconductor laser performance can be expected if quantum confinement can be achieved in more than one dimension.

In an article entitled "Quantum Wire Lasers", by E. Kapon, *Proceedings of the IEEE*, Vol. 80, No. 3, Mar. 1992, pages 398–410, there are described quasi one-dimensional structures in which optical gain is provided by charge carriers that are quantum-mechanically confined in two dimensions within wire-like active regions. Such QWR lasers are predicted to exhibit lower threshold currents, higher modulation bandwidths, narrower spectral linewidths and reduced temperature sensitivity compared to their QWL counterparts.

In practice, however, it has become evident that the actual fabrication of quantum-size structures with precise control in more than one dimension is an extremely challenging task. Several techniques for making such structures have been reported. Some of these techniques suffer from problems such as size fluctuations, interfacial disorder and the introduction of nonradiative recombination centers which wipe out quantum effects stemming from reduced dimensionality. One reported technique [see E. Kapon et al., *Phys. Rev. Lett.* 63, 430 (1989)] has been demonstrated to be a powerful one for fabricating quasi quantum wires exhibiting some characteristics of two-dimensional carrier confinement. But, as a consequence of the relatively large size of the wire-like structure achieved thereby, many one-dimensional subbands exist and, due to band-filling effects, only higher-order transitions can be observed in the stimulated emission spectra. Since the density-of-states spectrum in this energetic region already approaches that of the two-dimensional case, no improvement in threshold current over conventional QWL lasers was reported.

Accordingly, efforts have continued by workers skilled in the art directed at trying to provide improved QWR structures. In particular, these efforts have been directed at trying to develop a QWR structure having an extremely small cross-section that could in practice be fabricated to exhibit confinement in the one-dimensional quantum limit, i.e. in QWR structures with sufficient carrier confinement in two dimensions to allow for the formation of only a single bound one-dimensional state. It was recognized that these efforts, if successful, could provide a practical QWR laser characterized by a threshold for stimulated emission that is substantially reduced compared to that of a QWL structure.

SUMMARY OF THE INVENTION

In accordance with the principles of the present invention, a QWR structure comprises a set of extremely thin quantum well layers that intersect another extremely thin quantum well layer. The intersecting layers are usually orthogonally disposed with respect to each other to form a T-shaped geometry, although the intersection angle can in practice be any angle between about 5 and 90 degrees. In turn, these intersecting quantum wells are embedded in a larger T-shaped optical waveguiding arrangement having the same intersection angle. The waveguiding arrangement confines optical fields produced in the structure to wire-like regions formed along the intersections of the wells.

In accordance with the invention, a QWR structure is advantageously fabricated by cleaved edge overgrowth. This is a molecular-beam-epitaxy technique that accomplishes high-quality regrowth on in situ cleaved surfaces.

In further accord with the invention, optical emission from the wire-like regions of the T-shaped structure is stimulated by either optical pumping or electrical carrier injection techniques. The thicknesses of various ones of the quantum well layers in the aforementioned set of layers can be varied, thereby to provide an optical emission spectrum from the QWR device having outputs at various different wavelengths. With current injection, individual intersections can be separately accessed.

BRIEF DESCRIPTION OF THE DRAWING

A complete understanding of the present invention and of the above and other features and advantages thereof will be apparent from the detailed description below taken in conjunction with the accompanying drawing, not drawn to scale, in which.

DETAILED DESCRIPTION

In accordance with the principles of the present invention, a specific illustrative fabrication sequence will be described below. The sequence is adapted to make a QWR device that includes intersecting quantum wells that form a T-shaped structure. By way of a particular example, the cross-sectional dimensions of each wire-like region defined at an intersection will be assumed to be about seven nanometers by seven nanometers. In such a structure, quantum-bound states are formed with one-dimensional free carrier motion limited to the region defined by the intersecting wells. In turn, the wire-like regions are embedded in a T-shaped dielectric waveguide. In that way, an optical mode confined to the vicinity of the wire-like regions can be established. Stimulated excitonic emission from the fundamental energy transition in such one-dimensional quantum wires is thereby made possible.

Figure 1:
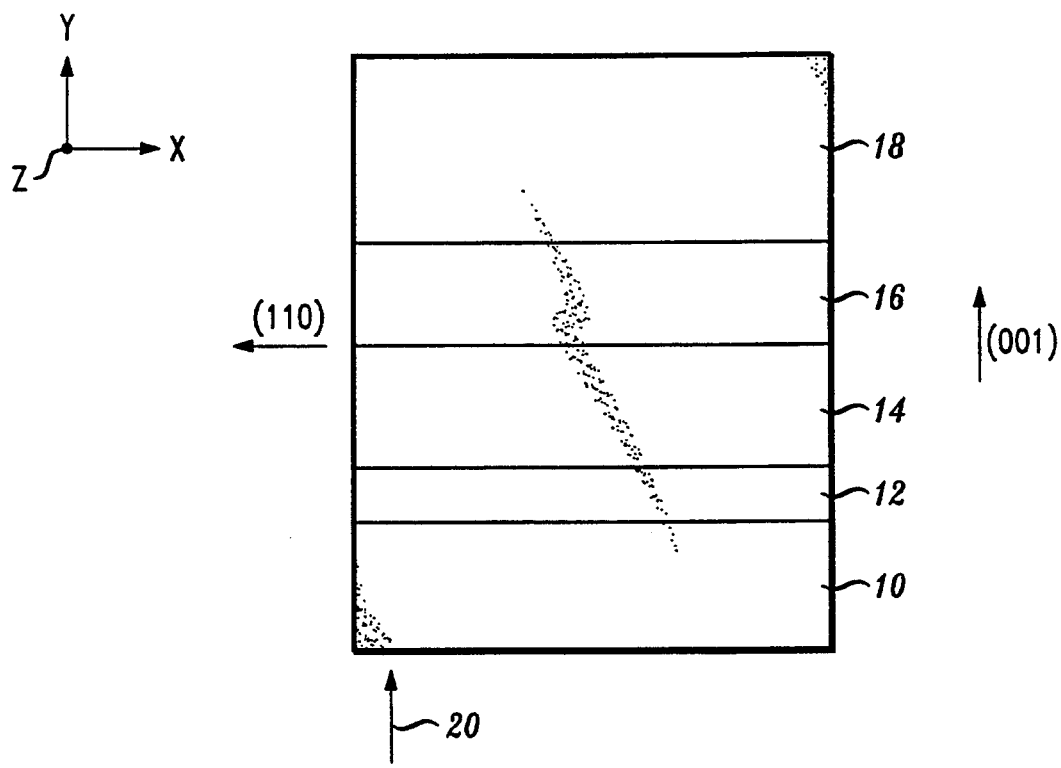
FIG. 1 is a schematic cross-sectional representation of a layered structure a portion of which constitutes a part of a specific illustrative QWR device made in accordance with the principles of the present invention.

In a first growth sequence, the multi-layer structure shown in FIG. 1 is formed by conventional molecular-beam-epitaxy (MBS) techniques in a standard deposition chamber. Thus, for example, successive layers are grown by MBE on a (001) gallium arsenide (GaAs) substrate 10 that is about 500 micrometers thick in the indicated Y direction. Advantageously, an epitaxial layer 12 approximately 500 nanometers thick is formed on the top surface of the substrate 10.

An optical waveguiding layer 14 is then grown overlying the layer 12 of FIG. 1. Illustratively, the layer 14 comprises a one-micrometer-thick layer of aluminum gallium arsenide (specifically, $Al_{0.5}Ga_{0.5}As$). Next, a quantum well region 16 is formed. The region 16 includes at least one conventional quantum well comprising well and barrier layers. Herein, for purposes only of a specific example, the region 16 will be assumed to be a multiple-quantum-well (MQW) region consisting of twenty-two periods. Each well in the region 16 is assumed, for example, to be made of GaAs and to have a thickness of about seven nanometers. Each barrier in the region 16 is assumed to be made of $Al_{0.35}Ga_{0.65}As$ and to be approximately thirty-eight nanometers thick. The exact nature of the MQW region 16 will be apparent later below in connection with the description of FIG. 3.

Subsequently, another optical waveguiding layer 18 also made, for example, of $Al_{0.5}Ga_{0.5}As$ is grown overlying the MQW region 16. Advantageously, the thickness of the illustrative layer 18 is about three micrometers. Importantly, the index of refraction of each of the waveguiding layers 14 and 18 is less than that of the MQW region 16.

After the aforespecified steps in the first growth sequence, the substrate 10 is thinned (for example, by lapping the backside thereof to a thickness of about 150 micrometers) to make it easier to cleave, prepared for cleaving and then reinserted into the MBE deposition chamber. Next, in the chamber, an in situ cleave is performed. The particular nature of the preparatory and cleaving steps required to accomplish such a cleave are known in the art, as described, for example, in an article by L. P. Pfeiffer, H. L. Stormer, K. W. Baldwin, K. W. West, A. R. Goni, A. Pinczuk, R. C. Ashoori, M. M. Dignam and W. H. Wegscheider entitled "Cleaved Edge Overgrowth for Quantum Wire Fabrication," *Journal of Crystal Growth* 127 (1993), pages 849–857.

As indicated in FIG. 1, the aforespecified cleave is initiated at arrow 20 along a line that is parallel to the Z axis. In that way, a fresh crystallographically perfect (110) surface is exposed. Subsequently, within about one-to-two seconds, a second growth sequence is started in the chamber on the clean (110) surface to form layers that are orthogonally disposed with respect to the layers formed during the first growth sequence.

In one specific illustrative sequence, four layers are formed on the indicated (110) surface. These are represented schematically in FIG. 2 by a three-layer region 22 and a layer 24. The layer 24 is about one micrometer thick in the indicated X direction and is made, for example, of $Al_{0.5}Ga_{0.5}As$. The exact nature of the region 22 will be described below in connection with FIG. 3 which is an enlargement of portion 26 of FIG. 2.

Figure 2:
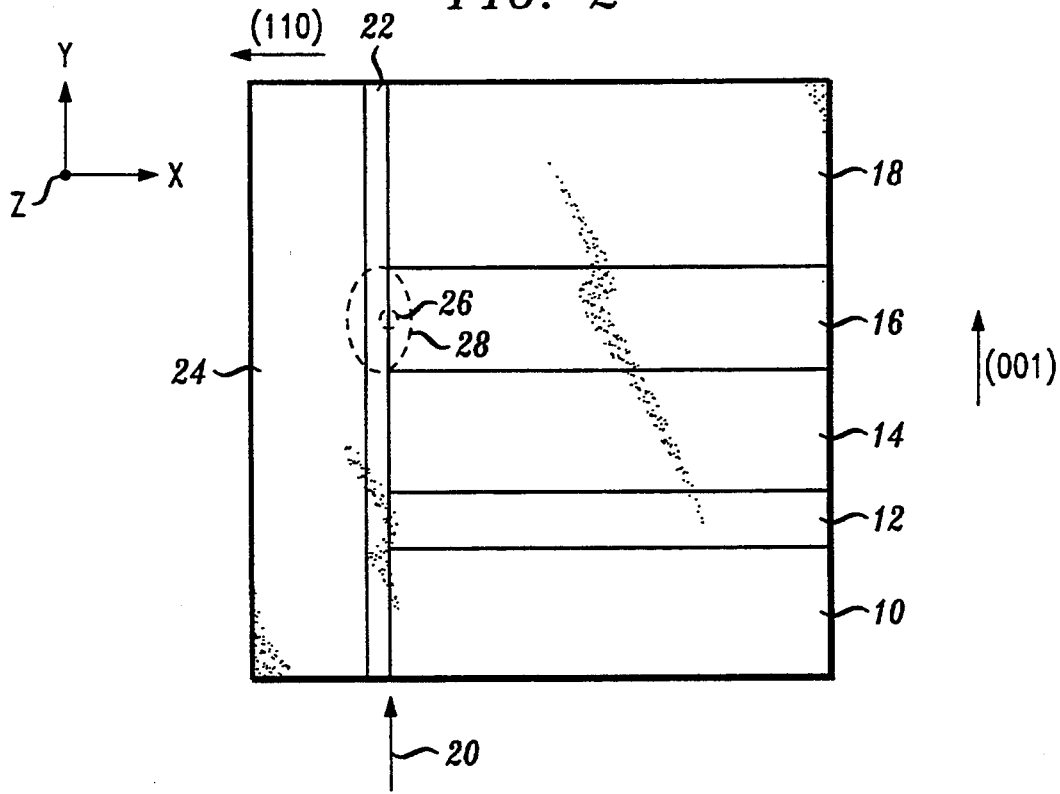
FIG. 2 depicts the FIG. 1 representation after it has been cleaved and another layered structure grown on the cleaved surface.

Dash line 28 in FIG. 2 represents approximately the outline of the optical mode that is generated in a structure of the type described herein. Optical stimulated emission is obtained from the structure primarily along the indicated Z axis, as will be described in more detail later below.

Figure 3:
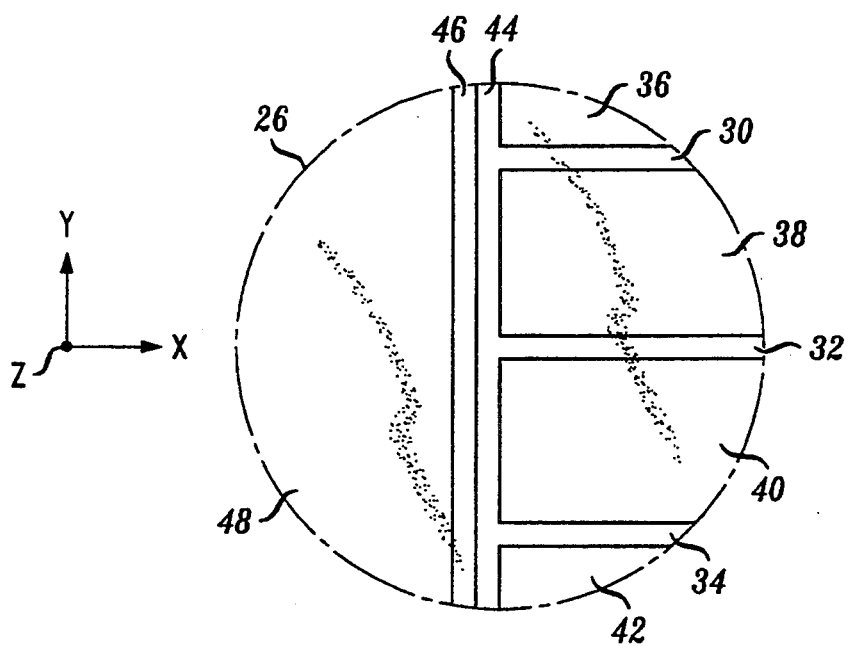
FIG. 3 is a magnified showing of a specified portion of the FIG. 2 depiction.

FIG. 3 shows both the configuration of the MQW region 16 and the nature of the region 22 depicted in FIG. 2. In particular, FIG. 3 shows portions of three of the aforementioned wells and four of the aforementioned barriers included in the MQW region 16. Also, FIG. 3 shows portions of the three layers that constitute the region 22 of FIG. 2.

In FIG. 3, layers 30, 32 and 34 constitute wells and layers 36, 38, 40, and 42 constitute barriers in the MQW region 16. The three layers of the region 22 formed during the second growth sequence are layers 44, 46 and 48.

Illustratively, the layer 44 shown in FIG. 3 constitutes a well made of GaAs and advantageously is about seven nanometers thick in the X direction. The layer 46 constitutes a barrier made, for example, of $Al_{0.35}Ga_{0.65}As$ and is also about seven nanometers thick. The layer 48 is made of a relatively high index-of-refraction material such as $Al_{0.1}Ga_{0.9}As$ and is approximately 167 nanometers thick.

As is evident from FIG. 3, the wells 30, 32 and 34 of the MQW region 16 intersect with the well 44 to form precise very-small-dimension T-shaped junctions. Each junction constitutes a wire-like region having a cross-section of approximately seven nanometers by seven nanometers. In the vicinity of each such junction, the electron wave function can expand by spreading its wavefunction a short way into each of the well arms that define the junction. This creates a bound state for the wire-like region that is many milli-electron volts below that of the adjacent wells.

The index of refraction of the three-layer region 22 of FIG. 2 is designed to be higher than that of the layer 24 and also higher than that of each of the layers 14 and 18. This, coupled with the previously mentioned fact that the index of refraction of the MQW region 16 is designed to be greater than that of the indices of the layers 14 and 18, makes it possible to provide a completely index-guided T-type structure. In this structure, any stimulated emission generated in the T-junctions is thereby confined to the vicinity of the T-junctions, as represented by dash line 28 of FIG. 2.

In a particular illustrative embodiment of the type specified herein, waveguiding along the described T-intersection was achieved. In this embodiment, the effective index of refraction of the region indicated by the dash line 28 in FIG. 2 was calculated to be approximately 0.03 higher than the index of any other region of the described device.

The herein-described optical waveguiding structure is not limited in practice to QWR devices. Such a waveguiding structure can also be used to fabricate a completely index-guided quantum well structure. In this way, an optical mode can be confined to dimensions of about one micrometer or less. Thus, for example, if in FIG. 2 the region 16 is designed to contain only $Al_{0.35}Ga_{0.65}As$ (no well material), optical emission from the well layer 44 of the region 22 is restricted to the region indicated by dash line 28.

Figure 4:
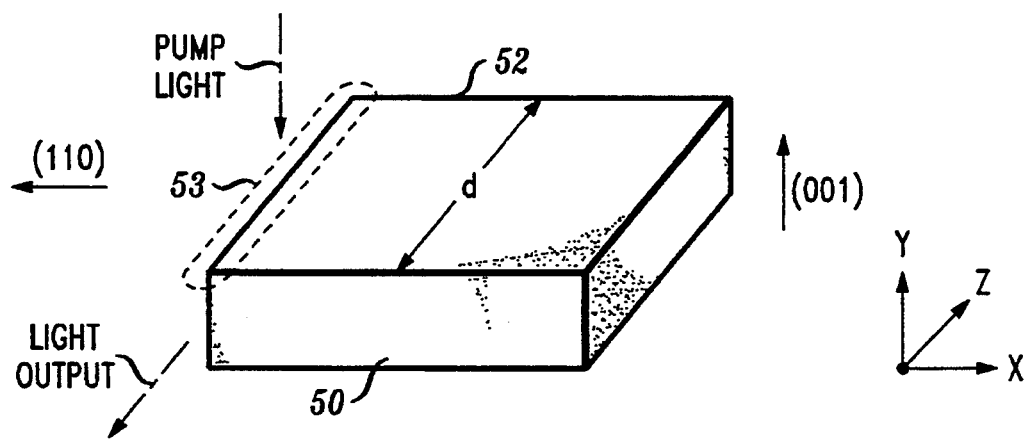
FIG. 4 is a simplified representation of a structure of the type shown in FIGS. 2 and 3 arranged to operate as an optically pumped QWR laser.

A complete QWR device made in accordance with this invention is schematically depicted in FIG. 4. In one specific illustrative embodiment, the Z-direction extent d of the aforespecified wire-like regions in the indicated device was about 600 nanometers. Advantageously, planar mirrors 50 and 52 normal to the QWR axis are formed by cleaving the respective front and back surfaces of the device. Pumping or optical activation of the device is done by directing light at the top of the device over an area that overlies the T-junction regions. More specifically, in one illustrative case, the pumping beam incident on the device surface was focused to a stripe about 700 micrometers in length in the Z direction and approximately five micrometers in width in the X direction. Thus, the stripe, which is indicated in FIG. 4 by dash line 53, is oriented parallel to the aforespecified wire-like regions.

In one particular case, optical pumping of the device shown in FIG. 4 was carded out by a standard continuously operating dye laser whose output was tuned to a wavelength of 775 nanometers. In response thereto, stimulated light output from the device occurred for pumping input powers that exceeded about ten milliwatts. At higher excitation powers (above about thirty-three milliwatts) the light output of the device was observed to be single-mode in nature and to occur at a wavelength of 792.5 nanometers. The device was immersed in superfluid helium (at a temperature of 1.7 degrees Kelvin).

Figure 5:
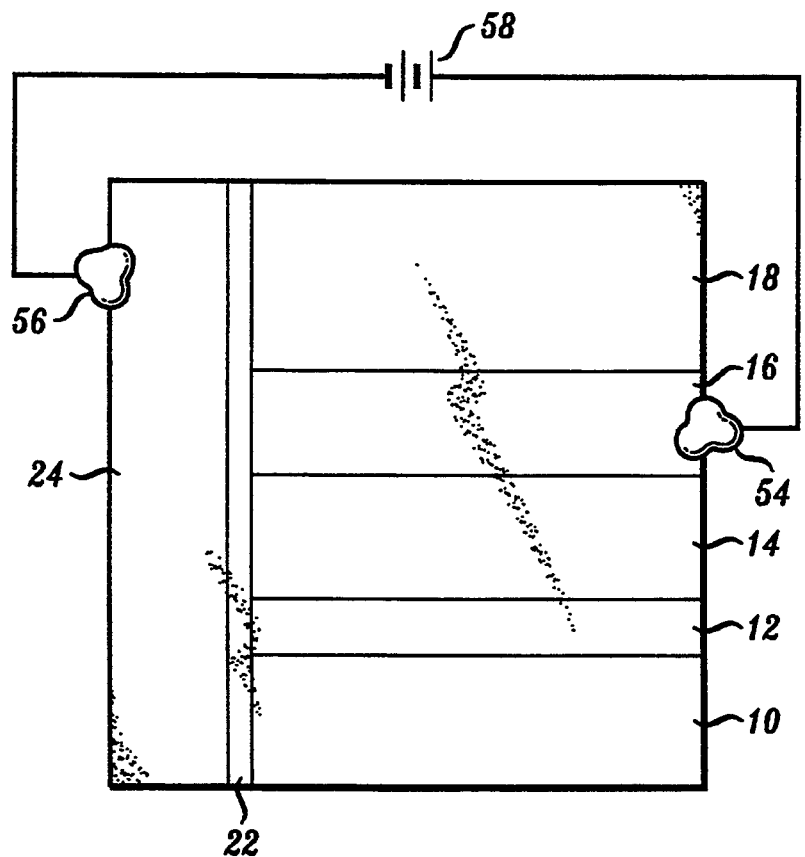
FIG. 5 is a simplified schematic showing of a structure of the type shown in FIGS. 2 and 3 arranged to operate as a QWR laser in which carriers are electrically injected into the wire-like regions thereof.

In an alternative embodiment of the invention, stimulated emission in a QWR laser is achieved by electrical injection of carders into the aforedescribed wire-like regions. In this alternative embodiment, which is represented in FIG. 5, selected portions of the structure are doped. More specifically, the one-micrometer-thick layer 24 and the 167-nanometer-thick layer 48 of the three-layer region 22 are doped with a dopant of one conductivity type. Further, either the wells or the barriers, or both the wells and the barriers, of the MQW region 16 are doped with a dopant of the opposite conductivity type. Moreover, if only the barriers are doped, it is advantageous to dope only central portions thereof, thereby to achieve the advantages of modulation doping. [Modulation doping is described, for example, by H. L. Stormer, R. Dingle, A. C. Gossard and W. Wiegmann, *Inst. Conf. Series*, London 43, 557 (1978).] In any case, dopant levels are selected to establish sufficient conductivity in the structure to realize practical values of current for carrier injection without causing excessive voltage drops in the structure, as is well known in the laser art.

In one particular illustrative device, the MQW region 16 was doped with a p-type dopant such as beryllium while the layers 24 and 48 were doped with an n-type dopant such as silicon. Then, as shown in FIG. 5, a p-type contact 54 was made to the region 16 and an n-type contact 56 was made to the layer 24. In that embodiment, a direct-current battery 58 poled as shown and connected to the contacts 54 and 56 is utilized to inject electrical carders into the T-junction wire-like regions of the device.

In accordance with the invention, an advantageous variant of the device represented in FIG. 5 is feasible. A portion of this variant is depicted in FIG. 6 which shows only parts of three wells and four barriers included in the MQW region 16 of FIG. 5.

Figure 6:
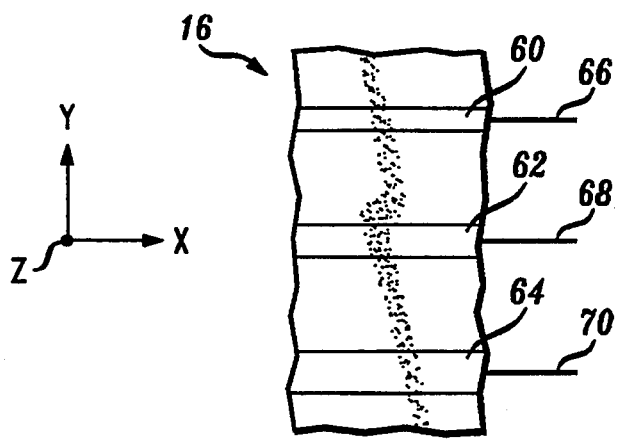
FIG. 6 represents a portion of a modified version of the FIG. 5 laser which is capable of providing stimulated emission at various different wavelengths.

In the FIG. 6 arrangement, some or all of the wells in the MQW region are designed to have different thicknesses. Thus, for example, well 60 is fabricated to have a Y-direction thickness of 6.8 nanometers, well 62 is made to have a thickness of 7.0 nanometers and well 64 is made to have a thickness of 7.2 nanometers. The barrier layers between the wells are all of the same thickness.

In FIG. 6, separate electrical contacts are established to the wells 60, 62 and 64, respectively. These separate contacts are schematically represented in FIG. 6 by electrical leads 66, 68 and 70. In that way, particular ones of the differently sized wells in the region 16 can be electrically activated to inject carriers into the aforedescribed wire-like T-junctions which these wells respectively define. As a result, the wavelength of the emission stimulated from each such T-junction is also different. Thus, the optical mode produced by the device can be thereby electrically controlled to contain one or more of the wavelengths respectively associated with the differently sized wells in region 16.

Thus, in accordance with the invention, stimulated excitonic emission from the fundamental energy transition in one-dimensional GaAs/AlGaAs quantum wires with extremely small lateral dimensions (for example, seven nanometers by seven nanometers) is achieved. Significantly, the threshold for stimulated emission in the quantum wires is found to be substantially reduced compared to the threshold for lasing from adjacent quantum wells.

Finally, it is to be understood that the above-described arrangements are only illustrative of the principles of the present invention. In accordance with these principles, numerous modifications and alternatives may be devised by those skilled in the art without departing from the spirit and scope of the invention. Thus, for example, the particular materials specified herein for fabricating the inventive devices described above are illustrative only. Other materials are well known and available from which to fabricate the intersecting wells and barriers as well as the layers that constitute the associated index-guided waveguiding structure. For example, it is apparent that indium gallium arsenide may be substituted for GaAs to make the various quantum well layers. Moreover, the various dimensions specified herein are illustrative only. By utilizing the described techniques, it is feasible to make T-junction wire-like regions having cross-sections even smaller than seven nanometers by seven nanometers.

What is claimed is:

1. A quantum wire device comprising
   means for forming at least one planar quantum well,
   means for forming another planar quantum well disposed at an angle with respect to said first-mentioned well to define a quantum wire region at the intersection of said wells,
   and means disposed about said wells for index guiding any emitted radiation to confine it to the vicinity of said quantum wire region.

2. A device as in claim 1 wherein said quantum wells are disposed orthogonally with respect to each other.

3. A device as in claim 2 wherein said first-mentioned quantum well comprises a planar well layer sandwiched between planar barrier layers.

4. A device as in claim 3 wherein said second-mentioned quantum well comprises a planar well layer and an overlying planar barrier layer.

5. A device as in claim 4 wherein said index guiding means comprises optical waveguiding layers on the respective surfaces of said first-mentioned quantum well.

6. A device as in claim 5 wherein said index guiding means further includes layers characterized by relatively high and relatively low indices of refraction disposed in that order on the surface of said overlying barrier layer.

7. A device as in claim 6 further including means for injecting carriers into said quantum wire region.

8. A device as in claim 7 wherein said injecting means comprises a source of optical pumping power.

9. A device as in claim 7 wherein said first-mentioned quantum well includes a dopant of one conductivity type and said layers characterized by relatively high and relatively low indices of refraction include a dopant of the opposite conductivity type.

10. A device as in claim 9 wherein said first-mentioned quantum well includes an electrical contact of said one conductivity type and said layer characterized by a relatively low index of refraction includes an electrical contact of said opposite conductivity type.

11. A device as in claim 10 wherein a direct-current battery is adapted to be connected between said contacts for injecting carriers into said quantum wire region.

12. A device as in claim 9 wherein said first-mentioned forming means forms plural quantum wells each comprising a planar well layer, whereby plural intersecting quantum wire regions are thereby formed.

13. A device as in claim 12 wherein each of the planar well layers in said first-mentioned forming means has a different thickness.

14. A device as in claim 13 wherein an electrical contact of said one conductivity type is made to each different one of said different-thickness layers and an electrical contact of said opposite conductivity type is made to said layer characterized by a relatively low index of refraction.

15. A device as in claim 14 wherein a direct-current battery is adapted to be connected between the electrical contact of said one conductivity type and one or more of the electrical contacts of said opposite conductivity type to cause stimulated emission from said quantum wire regions at one or more different frequencies.

16. A device as in claim 6 wherein said first-mentioned quantum well and said optical waveguiding layers on the respective surfaces of said first-mentioned quantum well are successively grown on the (001) surface of a substrate, and the layers comprising said orthogonally disposed quantum well and the layers characterized by relatively high and relatively low indices of refraction are successively grown overlying the (110) surface of said substrate.

17. A device as in claim 16 wherein said substrate comprises GaAs, said optical waveguiding layers on the respective surfaces of said first-mentioned quantum well each comprise $Al_{0.35}Ga_{0.65}As$ said layer characterized by a relatively high index of refraction comprises $Al_{0.1}Ga_{0.9}As$, said layer characterized by a relatively low index of refraction comprises $Al_{0.5}Ga_{0.5}As$, and the cross-section of each quantum wire region is approximately seven nanometers by seven nanometers.

18. A method of fabricating a quantum wire device, said method comprising the steps of
forming at least one planar quantum well,
forming another planar quantum well disposed at an angle with respect to said first-mentioned quantum well to define a quantum wire region at the intersection of said wells,
and forming a structure about said wells for index guiding any emitted radiation to confine it to the vicinity of said quantum wire region.

19. A method as in claim 17 wherein said first-mentioned forming step and a portion of said step for forming an index-guiding structure are carried out by successively growing layers on the (001) surface of a substrate.

20. A method as in claim 18 wherein said successively grown layers and said substrate are then cleaved to expose a (110) surface, and subsequently said second-mentioned forming step and the remaining portion of said step for forming an index-guiding structure are carded out by successively growing layers on said (110) surface.

21. A quantum device comprising
means for defining a quantum well,
and means including two intersecting waveguiding structures disposed about said defining means for completely index guiding emission from said well.

* * * * *